United States Patent
Chae et al.

(10) Patent No.: US 7,130,240 B2
(45) Date of Patent: Oct. 31, 2006

(54) SEMICONDUCTOR MEMORY SYSTEM AND METHOD FOR MULTI-SECTOR ERASE OPERATION

(75) Inventors: Dong-Hyuk Chae, Seoul (KR); Heung-Soo Lim, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 146 days.

(21) Appl. No.: 10/822,167

(22) Filed: Apr. 8, 2004

(65) Prior Publication Data

US 2004/0202042 A1    Oct. 14, 2004

(30) Foreign Application Priority Data

Apr. 8, 2003 (KR) .................... 10-2003-0021969
Nov. 11, 2003 (KR) .................... 10-2003-0079510

(51) Int. Cl.
*G11C 8/00* (2006.01)
(52) U.S. Cl. ............ 365/233; 365/230.06; 365/230.08; 365/185.29; 365/218
(58) Field of Classification Search ................ 365/233, 365/230.06, 230.08, 185.29, 218
See application file for complete search history.

(56) References Cited

U.S. PATENT DOCUMENTS

| | | | | |
|---|---|---|---|---|
| 4,356,482 A | * | 10/1982 | Oguchi | 345/667 |
| 4,654,695 A | * | 3/1987 | Fling | 348/671 |
| 5,332,922 A | * | 7/1994 | Oguchi et al. | 257/723 |
| 5,488,587 A | * | 1/1996 | Fukumoto | 365/222 |
| 5,526,316 A | * | 6/1996 | Lin | 365/221 |
| 5,570,381 A | * | 10/1996 | Schofield | 714/814 |
| 5,625,590 A | * | 4/1997 | Choi et al. | 365/185.17 |
| 5,848,026 A | * | 12/1998 | Ramamurthy et al. | 365/238.5 |
| 5,910,917 A | * | 6/1999 | Fukuzumi | 365/185.33 |
| 5,974,579 A | * | 10/1999 | Lepejian et al. | 714/733 |
| 6,097,666 A | * | 8/2000 | Sakui et al. | 365/230.06 |
| 6,278,654 B1 | * | 8/2001 | Roohparvar | 365/238.5 |
| 6,289,411 B1 | * | 9/2001 | Okumura et al. | 711/5 |
| 6,904,400 B1 | * | 6/2005 | Peri et al. | 703/28 |
| 2003/0117886 A1 | * | 6/2003 | Shiga et al. | 365/233 |
| 2006/0077721 A1 | * | 4/2006 | Sugio | 365/185.33 |

\* cited by examiner

*Primary Examiner*—Richard Elms
*Assistant Examiner*—Eric J. Wendler
(74) *Attorney, Agent, or Firm*—Marger, Johnson & McCollom, P.C.

(57) ABSTRACT

A semiconductor memory device is operable with a multi-sector erase mode for a multiplicity of memory chips, including a cell array, a register circuit containing information for a sector to be erased, an address clock driving circuit for contemporaneously generating an address clock signal from each memory chips, a counter for generating address signals in sequence, a core driver for executing an erase operation for the sector, and a control circuit thereof.

21 Claims, 11 Drawing Sheets

Fig. 1

(PRIOR ART)

Loaded Sector

Fig. 2

(PRIOR ART)

Fig. 3

(PRIOR ART)

Fig. 4

(PRIOR ART)

SEMICONDUCTOR MEMORY SYSTEM AND METHOD FOR MULTI-SECTOR ERASE OPERATION

This application relies for priority upon Korean Patent Application No. 2003-21969 filed on Apr. 8, 2003, and Korean Patent Application No. 2003-79510 filed on Nov. 11, 2003, the contents of which are herein incorporated by reference in their entirety.

FIELD OF THE INVENTION

The present invention relates to semiconductor memory technologies and more particularly, to semiconductor memory systems fabricated in multi-chip packages operable with multi-sector erase operations therein.

BACKGROUND OF THE INVENTION

A flash EEPROM (electrically erasable and programmable ROM) cell is formed with including a floating gate and a control gate. Such a flash memory cell is erased by discharging electrons of the floating gate to its substrate through an F-N tunneling effect when a high negative voltage is applied to a control gate of the memory cell. A flash memory cell array is normally divided in a plurality of sectors (or blocks) by the unit of bulks. Thus, memory cells includes in a sector, sharing one bulk, are contemporaneously erased in a time, which is called "sector erase" in general.

Receiving commands and sector addresses for sectors to be erased, an internal address counter increments an address value in sequence to designate the erasable sectors. Such a function to contemporaneously erase a multiplicity of sectors is called as a multi-sector erase operation.

The multi-sector erase operation, basically, needs registers with the same number of the sectors to be erased, and means to erase the sectors in response to the determination a current sector is an erasable sector in correspondence with the incrementing address.

Figure 1:
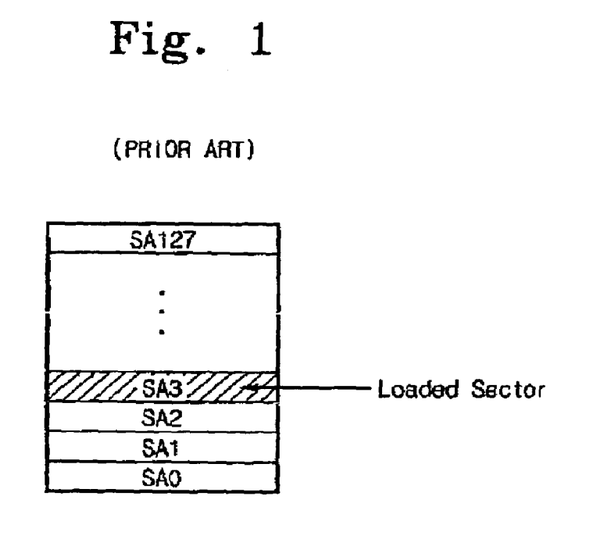
FIG. 1 is an illustration of a multi-sector erase scheme in a single chip.

A typical feature of the multi-sector erase scheme is illustrated in FIG. 1, for 128 sectors as an example in a single chip. The 128 sectors are assigned to sector addresses SA0~SA127. In this embodiment, it is assumed to designate the sector assigned to the address SA3.

An erase command and an address for a sector to be erased are supplied from an external controller. The external controller may supply a single address to erase a single sector or a plurality of addresses to erase a plurality of sectors in a time, which is referred to as "multi-sector erase" in a single chip. Such an address supply for the erase operation is called as "sector loading".

Figure 2:
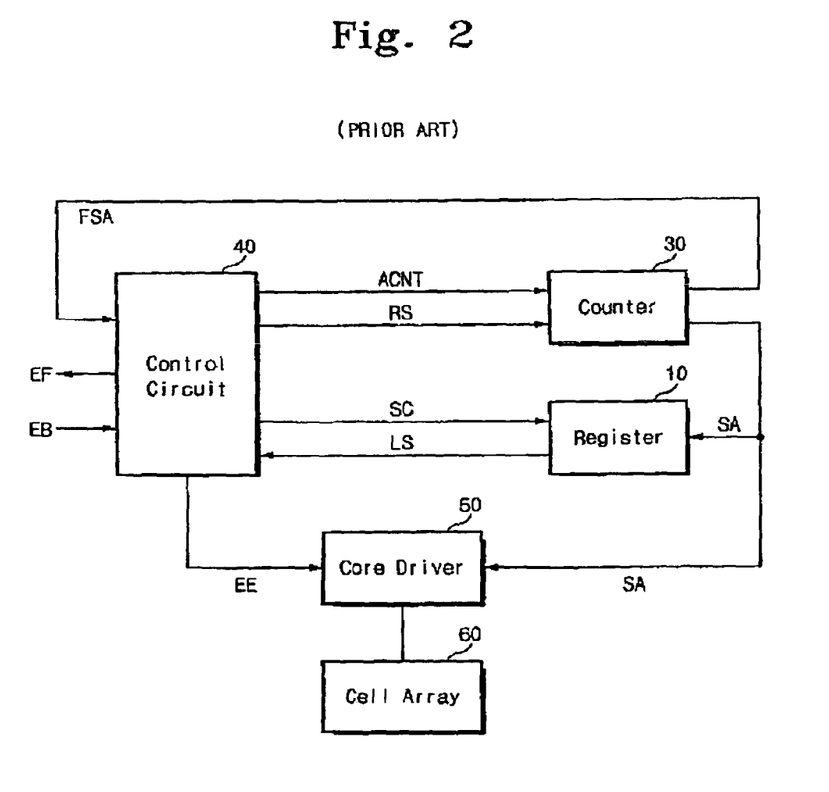
FIG. 2 is a functional block diagram for executing a multi-sector erase operation in a single chip.

FIG. 2 shows a functional construction for a single multi-sector erase operation in a single chip. A memory cell array 60 is also composed of a plurality of sectors. A register 10 stores addresses of sectors to be erased. A counter 30 generates sequential addresses in response to an address count-up signal ACNT. A control circuit 40 generates an erase enable signal EE when the sector address held in the register 10 is identified to a sector address provided from the counter 30, while generating the address count-up signal ACNT when the two addresses do not accord with each other. A core driver 50 carries out an erase operation for a sector designated therein in response to the erase enable signal EE.

Figure 3:
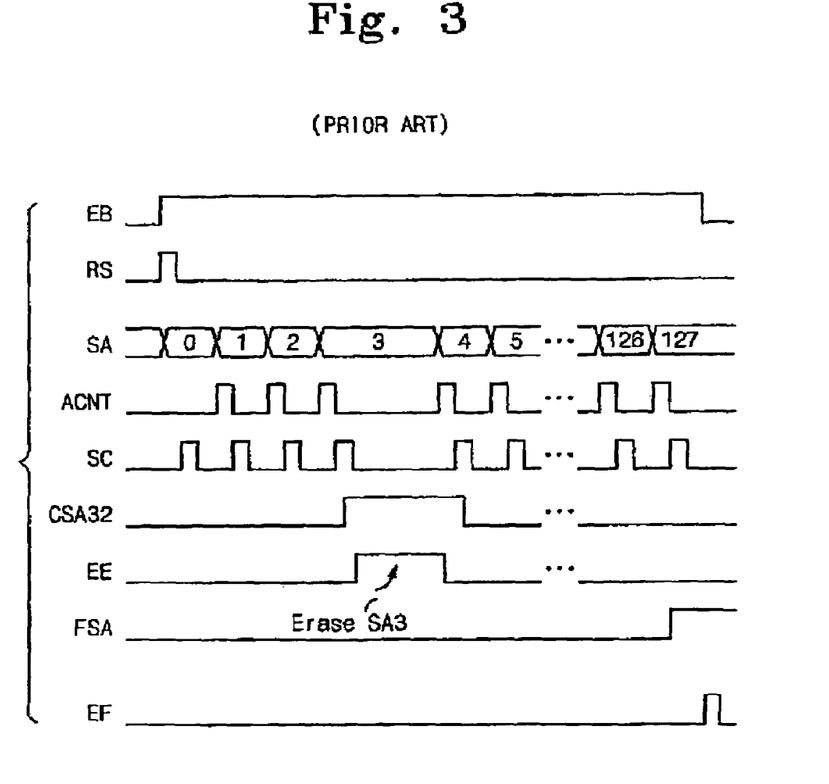
FIG. 3 is a timing diagram of a multi-sector erase operation in a single chip.
Figure 4:
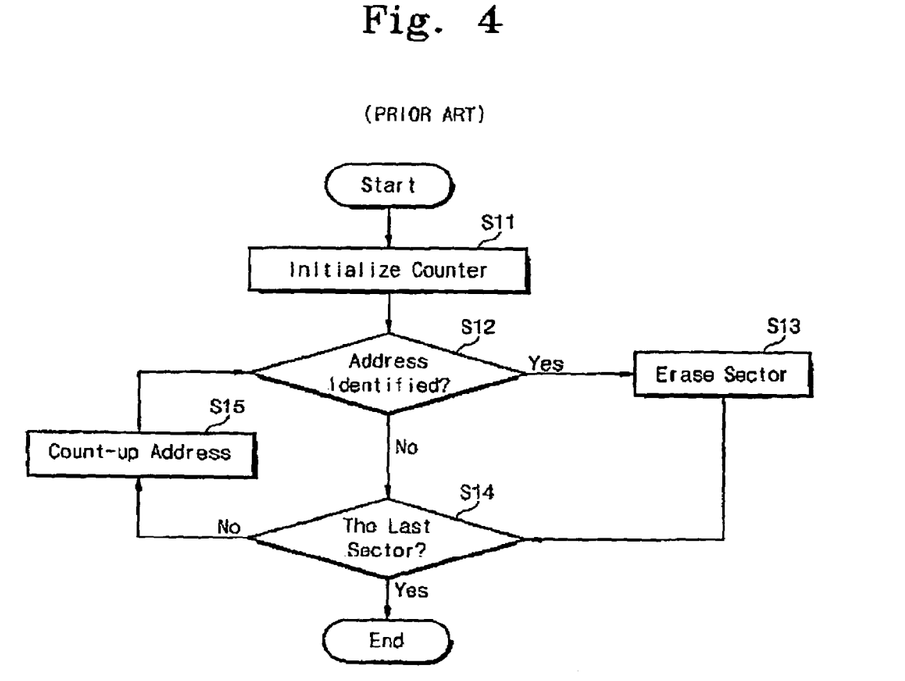
FIG. 4 is a flow chart of a multi-sector erase operation in a single chip.

FIGS. 3 and 4 illustrate a procedure of the multi-sector erase operation in a single chip shown in FIG. 2.

Referring to FIGS. 3 and 4, first, an erase command and a sector address (e.g. SA3) are introduced by way of an external controller. With the input of the erase command, the sector address SA3 to be erased is stored in the register 10. The register 10 is assigned to the sector each by each. The register 10 corresponding to the sector to be erased is set to "1" (binary digit), which informs the predetermination for erasing.

The multi-sector erase operation begins with an activation of an erase busy signal EB, together with the input of the erase command and sector address. At the beginning of the erase operation, the control circuit 40 initiates the address counter 30 on "0", which means all address values of the counter 30 are set to "0" (step S11). For instance, assuming that the memory cell array 60 is composed of 128 ($2^7$) sectors, all bits of the sector address SA[6:0] are set to "0". Next, the control circuit 40 generates a sector checking signal SC to determine an advance for a sector whose address is compared to the sector address (e.g., SA3) stored in the register 10 (step S12).

From the first sector address SA0, as the first sector address SA0 is not identical to the assigned sector address SA3, the control circuit 40 generates the address count-up signal ACNT to increment the sector address by the counter 30 (S15). Along the increment of the sector address, the control circuit 40 keeps checking out the sector address next to next. If a sector address supplied from the counter 30 is identical to the sector address SA3 held in the register 10, a sector loading signal LS is transferred to the control circuit 40 from the register 10. The sector loading signal LS makes an erase enable signal EE generated from the control circuit 40. The erase enable signal EE enables the core driver 50 to carry out an erase operation for the sector SA3 (step S13). In step S14, if a current sector address from the counter 30 is not the last one, it goes to the step S15 to increment the address value. The current sector address form the counter 30 reaches to the last one (e.g., SA127), the counter 30 generates a sector address finalizing signal FSA to be transferred to the control circuit 40. Then, the control circuit 40 generates an erase finish signal EF to terminate the erase operation for the assigned sector SA3.

Meanwhile, multi-chip packages are becoming standard in the IC industry because of increased device packing density, in which a plurality of semiconductor IC chips are fabricated with interconnections. A multi-chip memory package embedding a plurality of semiconductor memory chips acts as a single memory system having a large storage capacity of twice or more, which is advantageous to reducing manufacturing costs as well as to adapting for larger storage applications with smaller device volumes.

When the flash memories composed of a multiplicity of sectors and operable in the multi-sector erase modes are fabricated in such multi-chip packages, it needs to implement the multi-sector erase operations for the sectors of the flash memory chips contained in such a multi-chip memory package.

SUMMARY OF THE INVENTION

Therefore, the present invention is directed to a memory system configured in a multi-chip package including a plurality of memory chips with a multi-sector erase function.

The present invention provides a memory system having a plurality of memory chips, comprising: an address clock driver for generating an address clock signal in response to a current chip signal and an address count-up signal; a counter for generating an address including a chip information and a sector information; and a control circuit for generating the address count-up signal with reference to that the sector information corresponds to a sector to be erased.

The control circuit has a chip selection information to check the sector information when the chip selection information is identical to the chip information of the counter. An output of the address clock driver is conditioned at a high impedance state when the chip selection information is different from the chip information of the counter. The chip selection information is established by a hard-coded option. The counter generates addresses in sequence. The chip information of the counter corresponds to a most significant address bit.

In the another feature of the present invention, a memory system having a plurality of memory chips comprises: a memory cell array constructed of a plurality of sectors; a register circuit for storing a loaded sector information about a sector to be erased; an address clock driver for generating address clock signals contemporaneously for the chips in response to a current chip signal and an address count-up signal; a counter for generating an address including a chip information and a sector information; a control circuit for generating the address count-up signal and an erase enable signal with reference to that the loaded sector information corresponds to the sector information of the counter; and a core driver for carrying out an erase operation for a corresponding sector in response to the erase enable signal.

In the another feature of the present invention, a memory system having a plurality of memory chips comprises: a first bus for transferring control signals; a second bus for transferring address and data signals; and a plurality of memory chips connected to the first and second buses. Each memory chip comprises: a memory cell array constructed of a plurality of sectors; a register circuit for storing a loaded sector information about a sector to be erased; an address clock driver for generating address clock signals contemporaneously for the chips in response to a current chip signal and an address count-up signal; a counter for generating an address including a chip information and a sector information; a control circuit for generating the address count-up signal and an erase enable signal with reference to that the loaded sector information corresponds to the sector information of the counter; and a core driver for carrying out an erase operation for a corresponding sector in response to the erase enable signal.

The control circuit has a chip selection information to check the sector information when the chip selection information is identical to the chip information of the counter.

The present invention also provides a method of erasing multi-sectors in a multi-chip package including a counter, a control circuit, and a register circuit, the method comprising the steps of: initializing an address of the counter; determining whether a chip information of the counter is identical to a chip selection information of the control circuit; determining whether a sector information of the counter is identical to a loaded sector information of the register circuit when the chip information of the counter is identical to the chip selection information of the control circuit; erasing a sector corresponding to the loaded sector information when the sector information of the counter is identical to the loaded sector information; and terminating the multi-sector erase operation when an erased sector is the last sector.

When the chip information is different from the chip selection information, the address is incremented if a currently counted address is irrelevant to the last sector while terminating the multi-sector erase operation when a currently counted address is relevant to the last sector. The address is also incremented when the erased sector is irrelevant to the last sector.

The present invention will be better understood from the following detailed description of the exemplary embodiment thereof taken in conjunction with the accompanying drawings, and its scope will be pointed out in the appended claims.

BRIEF DESCRIPTION OF THE DRAWINGS

A more complete understanding of the present invention may be had by reference to the following description when taken in conjunction with the accompanying drawings in which.

DESCRIPTION OF THE PREFERRED EMBODIMENT

The numerous innovative teachings of the present application will be described with particular reference to presently preferred exemplary embodiments. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Hereinafter, the embodiments of the present invention are exemplarily applicable to a flash memory (or flash EEPROM) including a memory cell array divided into a plurality of sectors as units of erasing. Also is assumed that a memory system of the multi-chip package is constituted of two flash memory chips as the plural number although it is available to include more chips therein by the technical implications under the present invention. The number of sectors in each flash memory chip is assumed to be 128 ($2^7$).

Referring now to the drawings wherein like or similar elements are designated with identical reference numerals throughout the several views and wherein various elements depicted are not necessarily drawn to scale.

Figure 5:
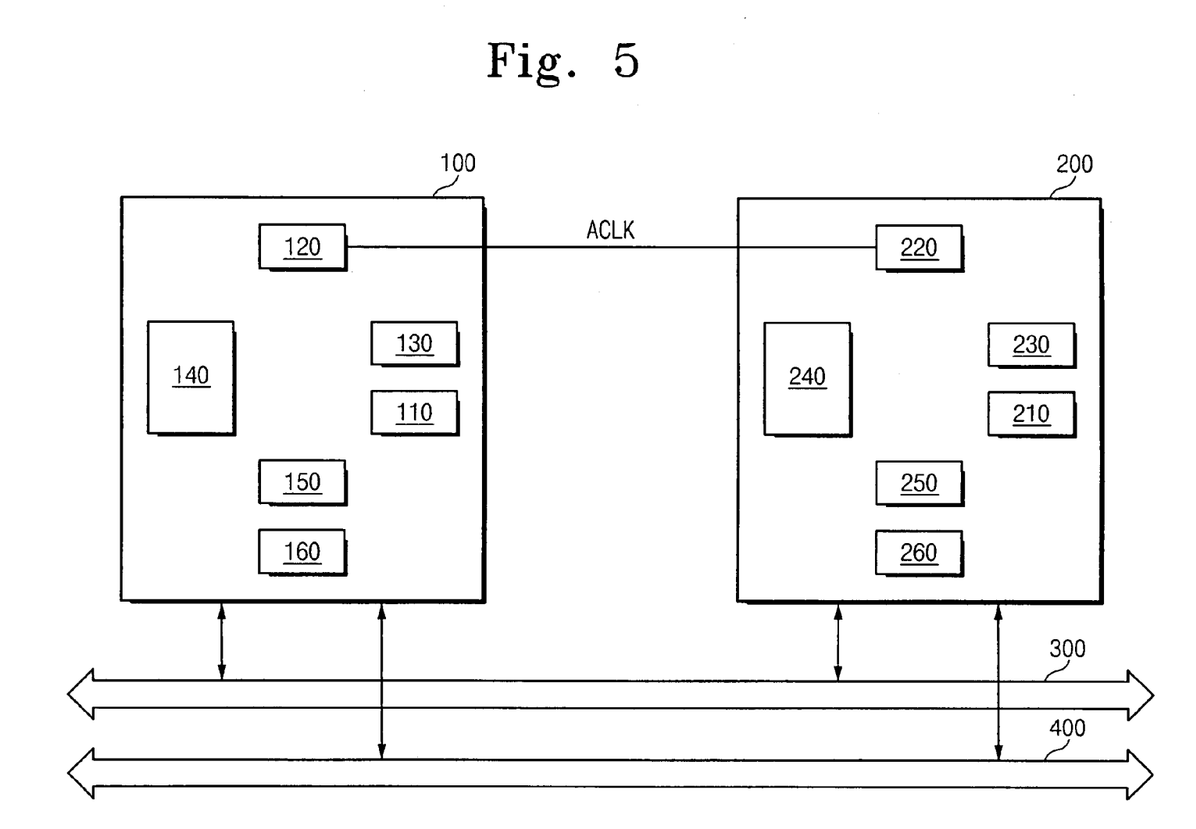
FIG. 5 is a block diagram of a semiconductor memory apparatus as constructed with a multi-chip package, according to the present invention.

FIG. 5 illustrates a semiconductor memory system fabricated in a multi-chip package operable with a multi-sector erase operation, including two flash memory chips 100 and 200. The two flash memory chips 100 and 200 have the same storage capacity and internal structure, sharing a control bus 300 and an address bus 400 in the multi-chip package as a single. The control bus 300 and the address bus 400 will be connected to a memory controller (not shown) out of the package. For the multi-sector erase operation, each flash memory chip has a register circuit (110 or 210), an address clock driving circuit (120 or 220), a counter (130 or 230), a control circuit (140 or 240), a core driver (150 or 250), and a memory cell array (160 or 260). Although other components in the flash memory chip are not disclosed in this embodiment, it may be properly understood they are comprised therein as a matter of course to carry out its own functions such reading, writing, and verifying as well as erasing.

Assuming each sector in the flash memory chip has the capacity of 512 Kb (for each of 128 sectors), the memory system of multi-chip package is regarded to as being a single storage device capable of storing 128 Mb data (64 Mb+64 Mb) of 256 sectors. If the package is organized with four flash memory chips of 64 Mb, the memory system of multi-chip package has the storage capacity of 256 Mb.

In FIG. 5, an address clock signal ACLK is applied to the address clock driving circuits 120 and 220 respectively of the flash memory chips 100 and 200 in common. The practical feature of operation associated with the address clock signal ACLK will be described later.

Figure 6:
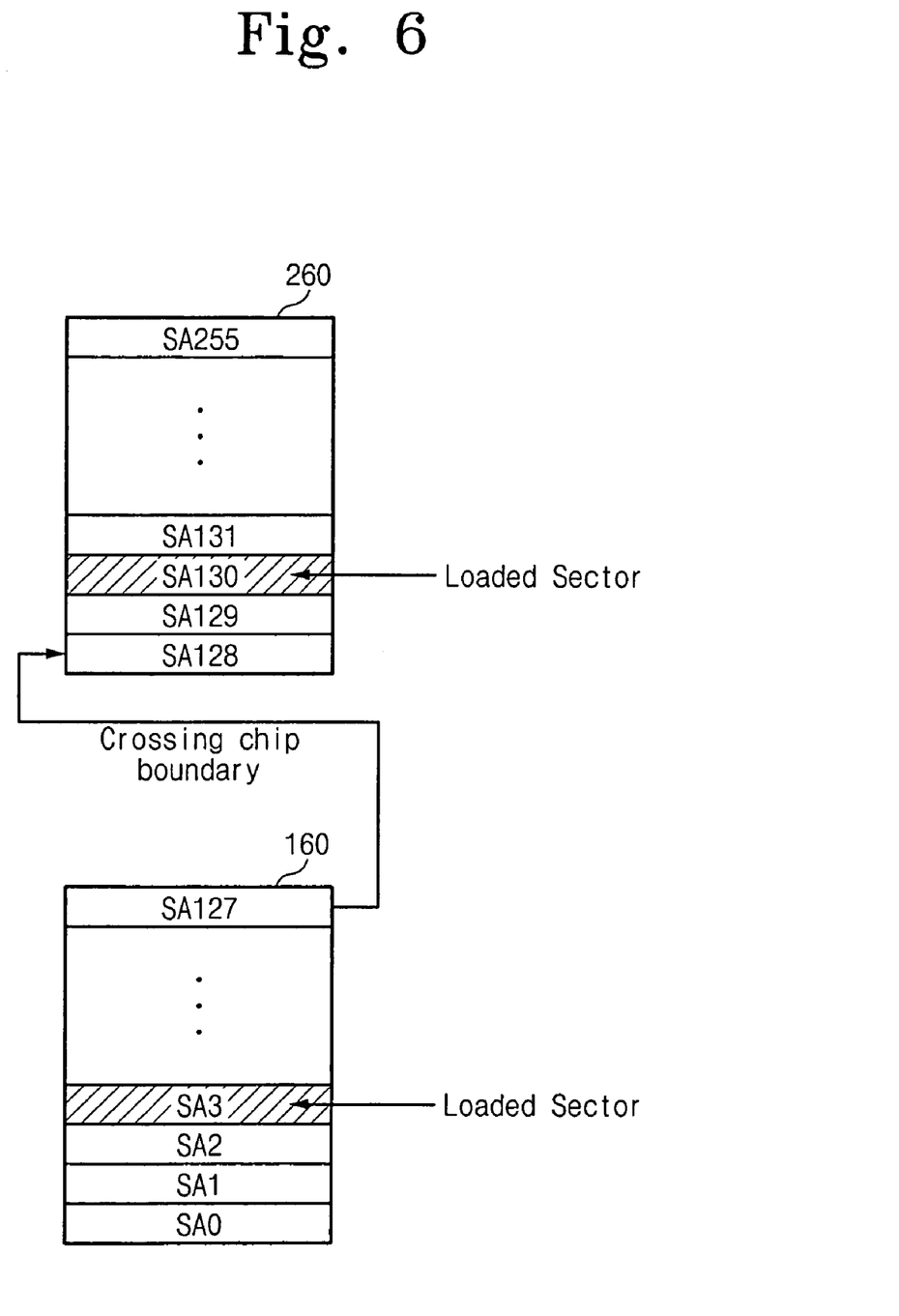
FIG. 6 is an illustration of a multi-sector erase operation in the multi-chip package shown in FIG. 5.

Referring to FIG. 6, the whole 256 sectors of the memory system over the flash memory chips 100 and 200 are arranged in the order of sector addresses SA0~SA255. The first 128 sectors assigned to SA0~SA127 belong to the memory cell array 160 of the first flash memory chip 100, while the second 128 sectors assigned to SA128~SA255 belong to the memory cell array 260 of the second flash memory chip 200. The loaded sectors for erasing are for example SA3 and SA130 respective to the chips 100 and 200. The erasing is carried out in the sequence from the first chip 100 to the second chip 200, responding to an activation of an erase busy signal rising when the erase command and the address of sectors to be erased are introduced into the memory system. Initializing an erase operation may be permissibly designed by means of an internal timer that determines a stating time of erasing after completing an input of the last sector address to be erased, or by using the erase command supplied from the external controller as well.

Figure 7:
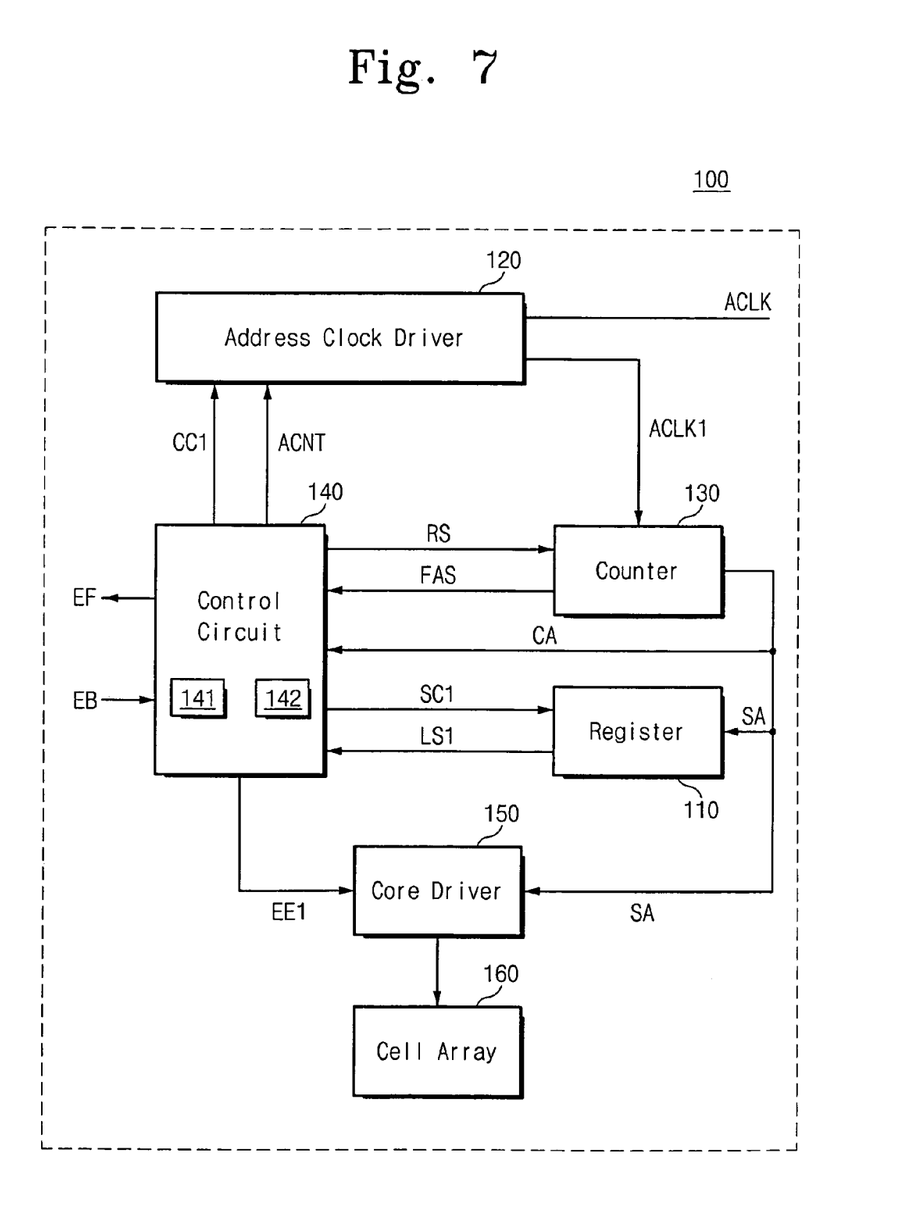
FIG. 7 is a functional block diagram of a single chip embedded in the multi-chip package, for executing the multi-sector erase operation shown in FIG. 6.

FIG. 7 shows functional interrelations between the elements in the first flash memory chip 100 as a representative. The second flash memory chip 200 has the same circuit structure with the first one 100.

The register circuit 110 includes 128 registers corresponding to the 128 sectors. Each register is assigned to each sector, receiving its corresponding sector address SA provided from the counter 130. Thus, the information about which sector is to be erased is determined by states of the registers assigned to the sectors. For instance, the register assigned to the sector of SA3 is set on "1" to erase the sector of SA3, while other registers are set on "0". The register circuit 110 applies a sector loading signal LS1 to inform the control circuit that the address of the predetermined sector to be erased is loaded in its corresponding register therein.

The address clock driving circuit 120 generates the common address clock signal ACLK and a first address clock signal ACLK1 in response to a current chip signal CC1 which are supplied from the control circuit 140. The common address clock signal ACLK is coupled to the address clock driving circuit 220 of the second flash memory chip 200 as well. The first address clock signal ACLK1 is applied to the counter 130.

The counter 130 increments address values in response to the first address clock signal ACLK1. The address values output from the counter 130 includes a chip address CA as well as a portion of the sector address SA.

As an example, the chip address CA is provided to distinguish the chips 100 and 200 in the erase operation. As the number of the chips in the multi-chip package of the memory system is two as an embodiment, the chip address CA is formed of one bit ("0" or "1") as an MSB in the bit stream of the address generated from the counter 130. Therefore, the address from the counter 130 is composed of one-bit chip address CA (SA[7]) for the two chips and seven-bit sector address SA[6:0] for the 128 sectors. If the multi-chip package contains four flash memory chips, the chip address CA will be formed of two bits.

Such bit compositions of the address would be easily designed in accordance with the numbers of chips and sectors. In a general feature, a memory system of multi-chip package with 2M-numbered chips and 2N-numbered sectors per a chip may need an address of M+N bits.

The counter 130 is initialized by a reset signal RS applied from the control circuit 140 and forwards a final address informing signal FAS to the control circuit 140. The chip address CA is applied to the control circuit 140, while the sector address SA is applied to the register circuit 110 and the core driver 150.

The control circuit 140 initializes the counter 130 by means of the reset signal RS in response to an erase busy signal EB. Such initialization for the counter is contemporaneous for all the counters 130 and 230. The control circuit 140 applies a current chip signal CC1 to the address clock driving circuit 120 when the first flash memory chip 100 is selected by the chip address CA (e.g., CA=SA[7]="0") to be put into the erase operation. The current chip signal CC1 makes the address clock driving circuit 120 to activate the first address clock signal ACLK1. When SA[7]=0, the other current chip signal CC2 in the second flash memory chip 200 is disabled (the second chip 200 is selected for erasing when SA[7]=1).

The control circuit 140 generates a sector check signal SC1 to check out a sector address provided from the counter 130 is identical to the pre-designated sector address SA3 stored in the register circuit 110. If a counted sector address is different from the sector address SA3, the control circuit 140 enables the count-up signal ACNT to increment an address value of the counter 130. If a counted sector address is identical to the sector address SA3, the control circuit 140 activates the erase enable signal EE1 in response to the sector loading signal LS1.

The erase enable signal EE1 generated from the control circuit 140 enables the core driver 150 to conduct an erase operation for the sector designated by the address SA3. The core driver 150 supplies a high voltage for erasing all memory cells of the designated sector of the memory cell array 150, in response to the erase enable signal EE1 and the corresponding sector address SA3.

Figure 9A:
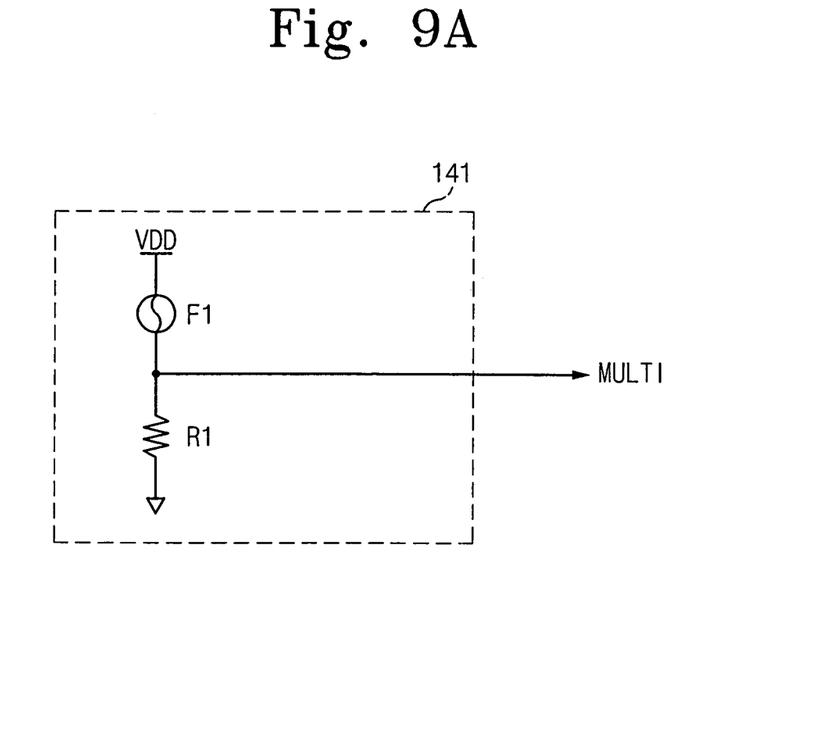
FIGS. 9A and 9B are circuit diagrams of the first and second flag generators shown in FIG. 7.

The control circuit 140 is further associated with flag generators 141 and 142. Referring to FIG. 9A, the first flag generator 141 makes a signal MULTI informing whether or not the flash memory chips 100 and 200 are configured to a multi-chip package. If the chips are included into the multi-chip package as a single memory system, the signal MULTI is set to "1" by keeping a fuse F1 connected to the power supply voltage VDD (not blown out). Otherwise, if either the chip 100 or 200 is to be utilized as a single chip, the signal MULTI is set to "0" by blowing the fuse F1 out, connecting the signal line to ground through resistor R1.

Figure 9B:
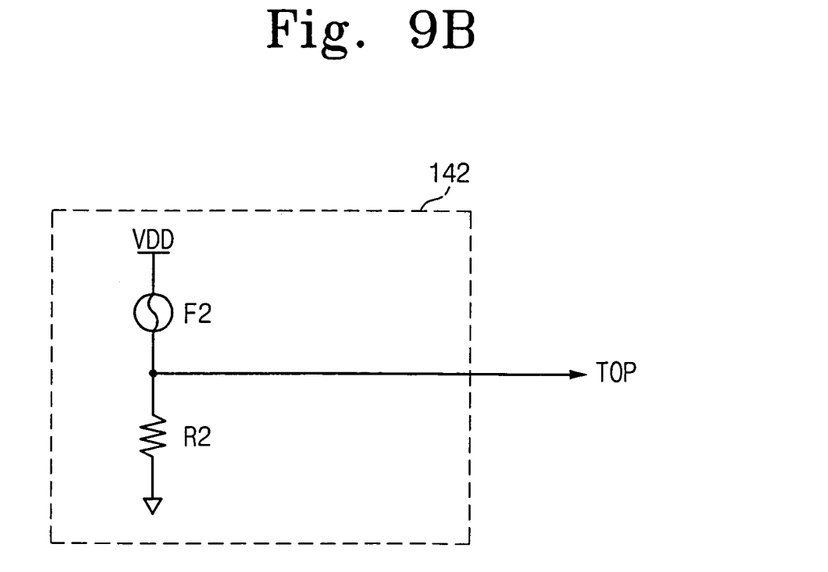

The second flag generator 142, referring to FIG. 9B, makes a signal TOP informing which one of the flash memory chips 100 and 200 assembled in the multi-chip package has the priority in the sequence of the multi-sector erase operation with reference to the address mapping. If the flash memory chip 100 is determined to be the first one to be erased, the signal TOP (i.e., a chip selection signal) is set to "0" by blowing a fuse F2 out (as the case of the present embodiment), connecting the signal line to ground through resistor R2. But, if the flash memory chip 200 is to be determined to be the first one, the chip selection signal TOP may be set to "1" by maintaining the fuse F2 without the blowing-out.

The bit number of the chip selection signal TOP will be variable in accordance with the number of the chips included in the multi-chip package as a single memory system. For instance, when four flash memory chips are assembled in the multi-chip package, the signal TOP will be composed of two bits for ordering the priority of erasing with the four chips. The flag generators 141 and 142 may be formed with other kinds of optional elements such as hard-coded bonds (i.e., bonding options).

Figure 8:
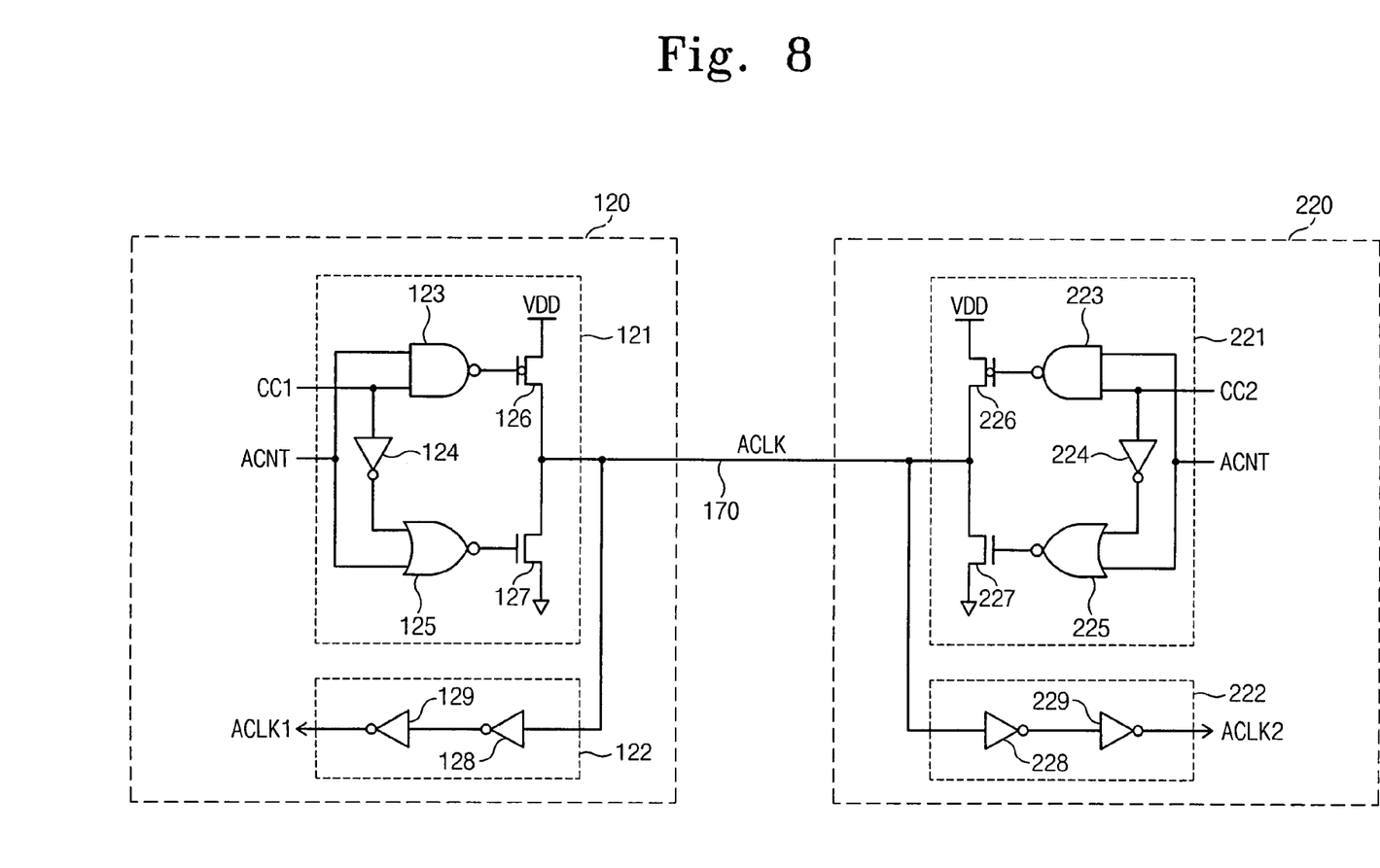
FIG. 8 is a circuit diagram of address clock driving circuits shown in FIG. 7.

FIG. 8 illustrates circuits of the address clock driving circuits, 120 and 220, respectively included in the first and second flash memory chips 100 and 200. The circuital structures of the chips 100 and 200 are identical each other.

The clock driver 120 of the first flash memory chip 100 is constructed of a driver 121 and a buffer 122. An output terminal 170 of the driver 121, from which the common address clock signal ACLK is generated, is shared with a driver 222 of the second chip 200. The common address clock signal ACLK is driven into the first and second address clock signals ACLK1 and ACLK2 each through the buffers 122 and 222.

In the driver 121 of the first address clock driving circuit 120, the first current chip signal CC1 is input to a NAND gate 123 and a NOR gate 125 through an inverter 124. The address count-up signal ACNT is also input to the NAND gate 123 and the NOR gate 125. An output of the NAND gate 123 is coupled to a gate of a PMOS transistor 126 connected between a power supply voltage VDD and the output terminal 170. An output of the NOR gate 125 is coupled to a gate of an NMOS transistor 127 connected between the output terminal 170 and a substrate voltage (or a ground). The buffer 122 is formed of inverters 128 and 129 those are serially connected from the output terminal 170. The inverter 129 outputs the first address clock signal ACLK1.

In the driver 221 of the second address clock driving circuit 220, the second current chip signal CC2 is input to a NAND gate 223 and a NOR gate 225 through an inverter 224. The address count-up signal ACNT is also input to the NAND gate 223 and the NOR gate 225. An output of the NAND gate 223 is coupled to a gate of a PMOS transistor 226 connected between the power supply voltage VDD and the output terminal 170. An output of the NOR gate 225 is coupled to a gate of an NMOS transistor 227 connected between the output terminal 170 and a substrate voltage (or a ground). The buffer 222 is formed of inverters 228 and 229 those are serially connected from the output terminal 170. The inverter 229 outputs the second address clock signal ACLK2.

Figure 10:
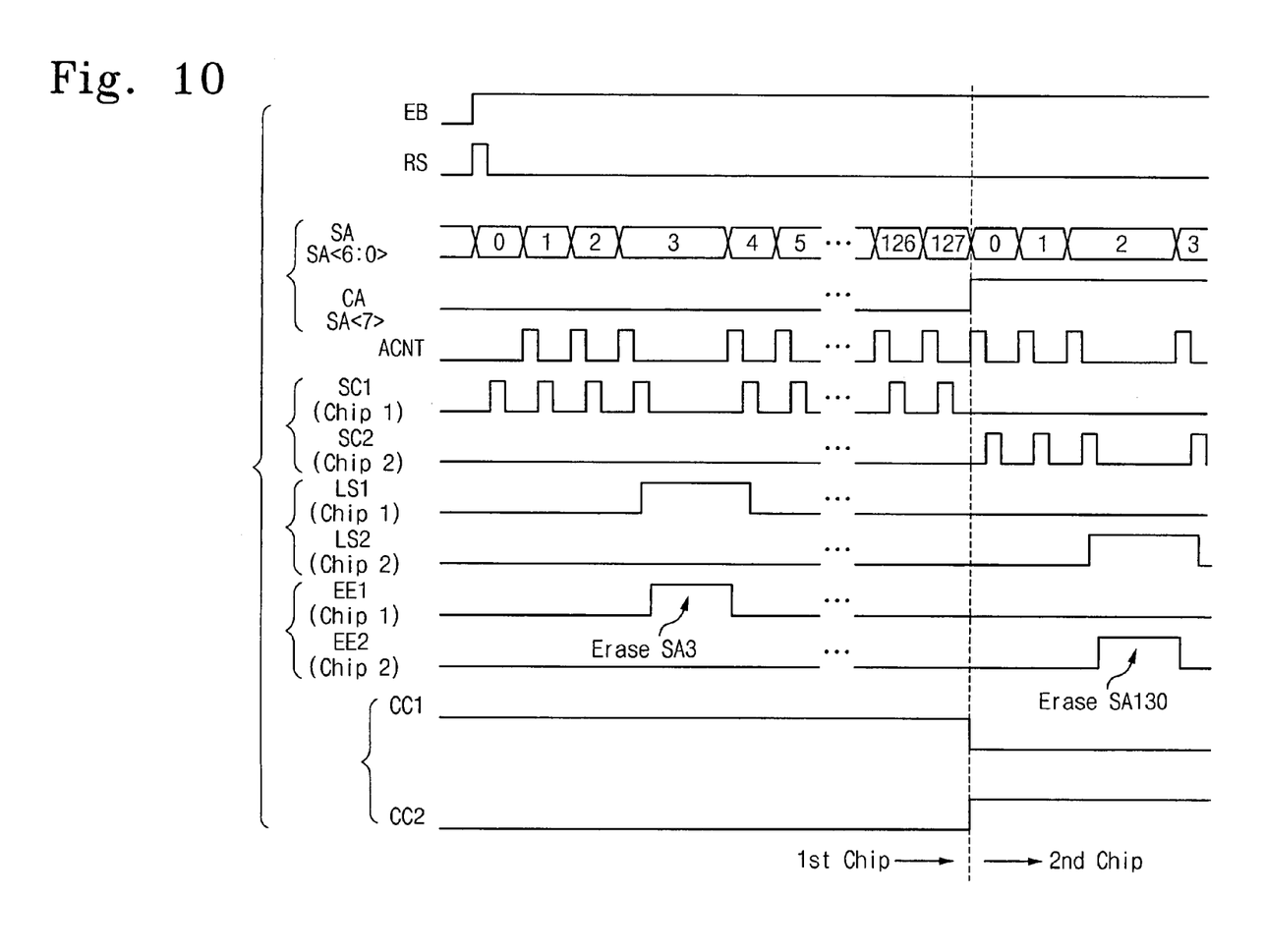
FIG. 10 is a timing diagram of the multi-sector erase operation in the multi-chip package shown in FIG. 5.
Figure 11:
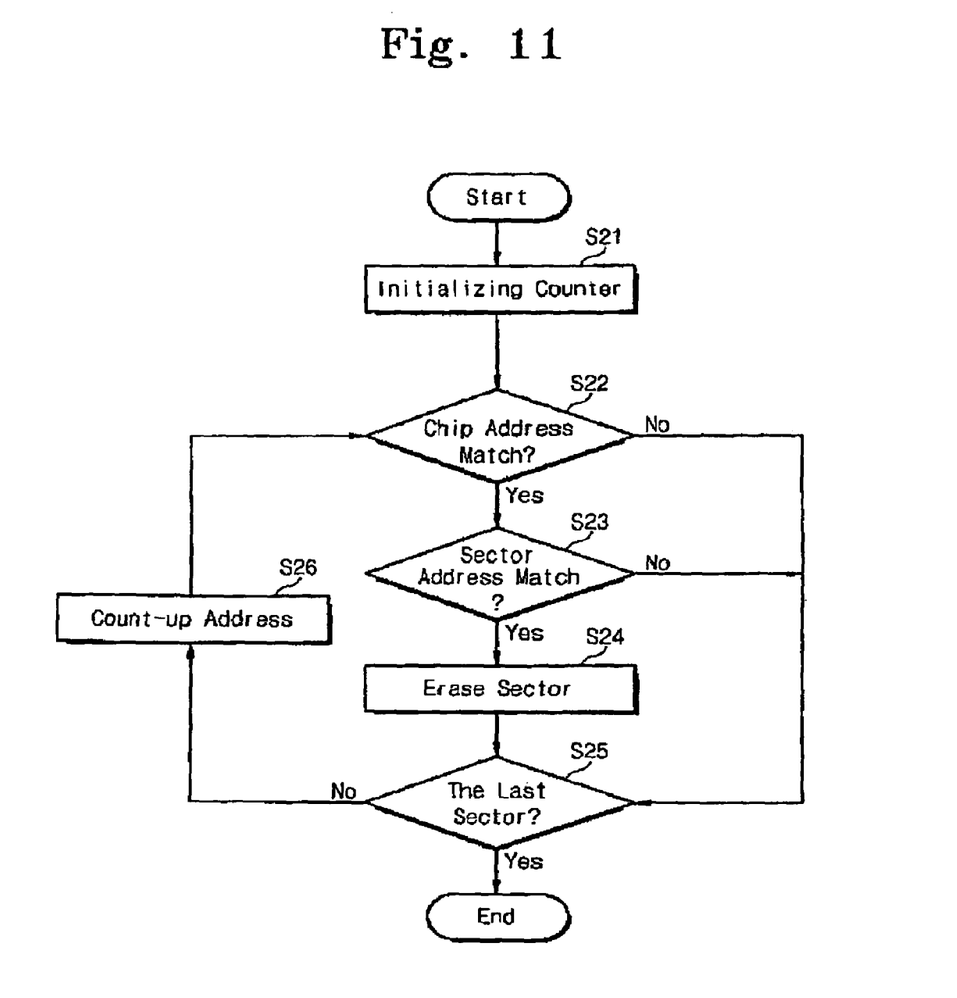
FIG. 11 is a flow chart of the multi-sector erase operation in the multi-chip package shown in FIG. 5.

Now, referring to FIGS. 10 and 11, the procedure of the multi-sector erase operation in the embodied multi-chip package as a single memory system will described. FIG. 10 illustrates signal timings and FIG. 11 summarizes sequential flows of the multi-sector erase operation with the flash memory chips 100 and 200 in the multi-chip package. In the operation, as aforementioned, it is assumed that the chip selection signal TOP is "0", the chip address CA is SA[7] ="0", and the sectors to be erased in the chips are assigned to the address SA3 and SA130 in the chips 100 and 200 respectively, which means the order of erasing is arranged from the first flash memory chip 100 to the second flash memory chip 200 as shown in FIG. 10.

First, when the erase busy signal EB is enabled in response to the input of the erase command and addresses to be erased, the control circuit 140 generates the reset signal RS, as a pulse, to contemporaneously initiate the counters 130 and 230 (S21 of FIG. 11).

Next, it determines whether or not the chip selection signal TOP is identical to the most significant address bit SA[7] (S22). Unless the chip information TOP matches with the current chip address CA (=SA[7]=0), i.e., TOP="1", it goes to S25.

As the chip selection signal TOP is identical to the chip address CA, i.e., SA[7]=0, the comparison between the counted address and the loaded sector address SA3 is conducted in S23. During this, the sector check signal SC1 is generated with active pulses every sector address in the first flash memory chip 100 to check out each counted address is identical to the loaded sector address SA3.

From the sector checking, if a currently counted address is not the loaded sector address SA3, the count-up signal ACNT enables the counter 130 to resume an address count-up operation in S26 after confirming the currently counted address is the last sector address in the S25.

With respect to the address count-up operation by the counter, referring to FIG. 8, the address count-up signal ACNT is applied to the NAND gate 123 and the NOR gate 125, together with the first current chip signal CC1 that is being active with a high level ("1") at present while the second current chip signal CC2 for the second chip 200 is inactive. As the PMOS and NMOS transistors, 126 and 127, are turned on and off, respectively, the common address clock signal ACLK is enabled with a high level and thereby the first internal address clock signal ACLK1 is enabled with a high level as well as the second internal address clock signal ACLK2. While this, as the second current chip signal CC2 is inactive with a low level, both the PMOS and NMOS transistors, 226 and 227, are turned off to make the output terminal of the driver 221 conditioned at a high impedance state. The reverse case (CC2 is active while CC1 is inactive) in the address clock drivers is as same as the former mechanism.

Returning to FIGS. 10 and 11, in S23, if the currently counted address is the sector address SA3, the sector loading signal LS1 is enabled to activate the erase enable signal EE1 and thereby the erase operation is carried out for the loaded sector of SA3 in S24. The address count-up range for the first flash memory chip 100 is from "00000000" (SA1)to "01111111" (the last sector address SA127). When the counted address reaches the last sector address, the erase operation for the first flash memory chip 100 is terminated.

As illustrated in FIG. 10, while the first flash memory chip 100 is being taken into the sector erase operation, the control circuit 200 of the second flash memory chip 200 does not generates its own sector check signal SC2 and erase enable signal EE1. However, if the counted address reaches the last sector (i.e., SA127="01111111"), the operation turns to the second flash memory chip 200 because the address changes to "10000000". That is, SA[7] corresponding to the chip address CA transitions from "0" to "1", as shown in FIG. 10, which is assigned to the second flash memory chip 200 under the erase order as pre-assumed.

By the changeover of the erase operation from the first chip 100 to the second chip 200, the aforementioned operation illustrated in FIG. 10 and will be carried out for the second flash memory chip 200 as same. The address count-up range for the second flash memory chip 200 is from "10000000" (SA128)to "11111111" (the last sector address SA255). During this, the current chip signal CC1, the sector check signal SC2, the sector loading signal LS2, and the erase enable signal EE2 are active while CC1, SC1, LS1, and EE2 are being inactive. When the counted address reaches the last sector address SA255, the erase operation for the first flash memory chip 100 is terminated.

As described above, the present invention provides a memory system configured in a multi-chip package including a plurality of memory chips with a multi-sector erase function.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. A memory system having a plurality of memory chips, comprising:
    an address clock driver to generate an address clock signal in response to a current chip signal and an address count-up signal, wherein the current chip signal activates a currently selected chip from the plurality of memory chips;
    a counter to generate an address including a chip information and a sector information, wherein the chip information identifies the chip from the plurality of memory chips and the sector information includes sector addresses arranged across the memory system; and
    a control circuit to generate the address count-up signal with reference to that the sector information corresponds to a sector to be erased.

2. The memory system as set forth in claim 1, wherein the control circuit has a chip selection information to check the sector information when the chip selection information is identical to the chip information of the counter.

3. The memory system as set forth in claim 1, wherein an output of the address clock driver is conditioned at a high impedance state when the chip selection information is different from the chip information of the counter.

4. The memory system as set forth in claim 2, wherein the chip selection information is established by a hard-coded option.

5. The memory system as set forth in claim 1, wherein the counter generates addresses in sequence.

6. The memory system as set forth in claim 5, wherein the chip information of the counter corresponds to a most significant address bit.

7. A memory system having a plurality of memory chips, comprising:
    a memory cell array constructed of a plurality of sectors, wherein the sectors have addresses across the memory system;
    a register circuit to store a loaded sector information about a sector to be erased;
    an address clock driver to generate address clock signals contemporaneously for the chips in response to a current chip signal and an address count-up signal;
    a counter to generate an address including a chip information and a sector information, wherein the chip information identifies the chip active from the plurality of memory chips;
    a control circuit to generate the address count-up signal and an erase enable signal with reference to that the loaded sector information corresponds to the sector information of the counter; and
    a core driver to carry out an erase operation for a corresponding sector in response to the erase enable signal.

8. The memory system as set forth in claim 7, wherein the control circuit has a chip selection information to check the sector information when the chip selection information is identical to the chip information of the counter.

9. The memory system as set forth in claim 7, wherein an output of the address clock driver is conditioned at a high impedance state when the chip selection information is different from the chip information of the counter.

10. The memory system as set forth in one of claims 8 and 9, wherein the chip selection information is established by a hard-coded option.

11. The memory system as set forth in claim 7, wherein the counter generates addresses in sequence.

12. The memory system as set forth in claim 11, wherein the chip information of the counter corresponds to a most significant address bit.

13. A mommy system having a plurality of memory chips, comprising:
    a first bus to transfer control signals;
    a second bus to transfer address and data signals; and
    a plurality of memory chips connected to the first and second buses, wherein each memory chip comprises:
        a memory cell array constructed of a plurality of sectors, wherein the sectors have addresses across the memory system;
        a register circuit to store a loaded sector information about a sector to be erased;
        an address clock driver to generate address clock signals contemporaneously for the chips in response to a current chip signal and an address count-up signal;
        a counter to generate an address including a chip information and a sector information, wherein the chip information identifies the chip from the plurality of chips;
        a control circuit to generate the address count-up signal and an erase enable signal with reference to that the loaded sector information corresponds to the sector information of the counter; and
        a core driver to carry out an erase operation for a corresponding sector in response to the erase enable signal.

14. The memory system as set forth in claim 13, wherein the control circuit has a chip selection information to check the sector information when the chip selection information is identical to the chip information of the counter.

15. The memory system as set forth in claim 13, wherein an output of the address clock driver is conditioned at a high impedance state when the chip selection information is different from the chip information of the counter.

16. The memory system as set forth in one of claims 14 and 15, wherein the chip selection information is established by a hard-coded option.

17. The memory system as set forth in claim 13, wherein the counter generates addresses in sequence.

18. The memory system as set forth in claim 17, wherein the chip information of the counter corresponds to a most significant address bit.

19. A method of erasing multi-sectors in a multi-chip package including a counter, a control circuit, and a register circuit, the method comprising:
   initializing an address of the counter;
   determining whether a chip information of the counter is identical to a chip selection information of the control circuit, wherein the chip information identifies chip from a plurality of chips;
   determining whether a sector information of the counter is identical to a loaded sector information of the register circuit when the chip information of the counter is identical to the chip selection information of the control circuit, wherein the sector information includes a sector address across a memory system comprised of the multi-chip package;
   erasing a sector corresponding to the loaded sector information when the sector information of the counter is identical to the loaded sector information; and
   terminating the multi-sector erase operation when an erased sector is the last sector.

20. The method as set forth in claim 19, further comprising, when the chip information is different from the chip selection information, incrementing the address if a currently counted address is irrelevant to the last sector while terminating the multi-sector erase operation when a currently counted address is relevant to the last sector.

21. The method as set forth in claim 19, further comprising incrementing the address when the erased sector is irrelevant to the last sector.

* * * * *

UNITED STATES PATENT AND TRADEMARK OFFICE
CERTIFICATE OF CORRECTION

| | | |
|---|---|---|
| PATENT NO. | : 7,130,240 B2 | Page 1 of 1 |
| APPLICATION NO. | : 10/822167 | |
| DATED | : October 31, 2006 | |
| INVENTOR(S) | : Dong-Hyuk Chae et al. | |

It is certified that error appears in the above-identified patent and that said Letters Patent is hereby corrected as shown below:

Column 10, line 34, the word "mommy" should read -- memory --.

Signed and Sealed this

Twelfth Day of August, 2008

JON W. DUDAS
*Director of the United States Patent and Trademark Office*